(12) United States Patent
Deillon et al.

(10) Patent No.: US 9,912,313 B2
(45) Date of Patent: Mar. 6, 2018

(54) METHOD OF MANUFACTURING AN ENCAPSULATION DEVICE

(71) Applicant: Micro Crystal AG, Grenchen (CH)

(72) Inventors: Léa Deillon, Lausanne (CH); Silvio Dalla Piazza, St-Imier (CH); Thierry Hessler, St-Aubin (CH)

(73) Assignee: Micro Crystal AG, Grenchen (CH)

( * ) Notice: Subject to any disclaimer, the term of this patent is extended or adjusted under 35 U.S.C. 154(b) by 747 days.

(21) Appl. No.: 14/360,403

(22) PCT Filed: Oct. 23, 2012

(86) PCT No.: PCT/EP2012/070972
§ 371 (c)(1),
(2) Date: May 23, 2014

(87) PCT Pub. No.: WO2013/075901
PCT Pub. Date: May 30, 2013

(65) Prior Publication Data
US 2014/0312735 A1    Oct. 23, 2014

(30) Foreign Application Priority Data

Nov. 23, 2011 (EP) .................................. 11190264

(51) Int. Cl.
*H03H 3/007* (2006.01)
*H03H 3/02* (2006.01)
(Continued)

(52) U.S. Cl.
CPC ....... *H03H 3/0072* (2013.01); *B81C 1/00269* (2013.01); *H03H 3/02* (2013.01);
(Continued)

(58) Field of Classification Search
CPC .......... H03H 3/0072; H03H 3/02; H03H 3/04; H03H 2003/022; H03H 2003/026;
(Continued)

(56) References Cited

U.S. PATENT DOCUMENTS 4,362,961 A * 12/1982 Gerber ..................... H03H 3/02
29/25.35
2008/0309202 A1* 12/2008 Dalla Piazza .. H03H 2003/0492
310/348
(Continued)

FOREIGN PATENT DOCUMENTS

JP    2009278562 A * 11/2009
JP    2010171241 A *  8/2010

OTHER PUBLICATIONS

Smith, W.F., Principles of Materials Science and Engineering, 1986, McGraw-Hill Inc., p. 115.*
(Continued)

*Primary Examiner* — A. Dexter Tugbang
(74) *Attorney, Agent, or Firm* — Oblon, McClelland, Maier & Neustadt, L.L.P.

(57) ABSTRACT

An element is arranged to cooperate with another part so as to form an encapsulation device for a component including the element at least partially coated with a metallization. The metallization includes at least one metal layer protected by an intermetallic compound which is coated by a non-diffused portion of a material whose melting point is lower than 250° C. A method of fabricating the encapsulation device is also disclosed.

14 Claims, 4 Drawing Sheets

(51) Int. Cl.
  *B81C 1/00* (2006.01)
  *H03H 9/02* (2006.01)
  *H03H 3/04* (2006.01)

(52) U.S. Cl.
  CPC .......... *H03H 3/04* (2013.01); *H03H 9/02244* (2013.01); *H03H 2003/022* (2013.01); *H03H 2003/026* (2013.01); *H03H 2003/0478* (2013.01); *H03H 2003/0485* (2013.01); *H03H 2003/0492* (2013.01); *Y10T 29/42* (2015.01); *Y10T 29/49005* (2015.01); *Y10T 29/49574* (2015.01)

(58) Field of Classification Search
  CPC ... H03H 2003/0478; H03H 2003/0485; H03H 2003/0492; H03H 9/02244; B81C 1/00269; Y10T 29/42; Y10T 29/49005; Y10T 29/49574
  See application file for complete search history.

(56) References Cited

U.S. PATENT DOCUMENTS

2011/0068659 A1* 3/2011 Ichikawa ......... H03H 2003/026
  310/344
2011/0266030 A1 11/2011 Swaminathan et al.

OTHER PUBLICATIONS

International Search Report issued in corresponding application PCT/EP2012/070972, completed Dec. 3, 2012 and dated Dec. 17, 2012.

Wang P J et al: "Fluxless Wafer-to-Wafer 1-9, Bonding in Vacuum Using Electroplated 11-18 Sn-Rich Sn—Ag Dual-layer Structure", Electronic Components and Technology Conference 2006, 56th San Diego, CA May 30-Jun. 2, 2006, Piscataway, NJ, USA, IEEE, May 30, 2006 (May 30, 2006), pp. 1290-1293, XP010923549.

Sung-Hoon Choa: "Reliability study of hermetic wafer level MEMS packaging with through-wafer interconnect". Microsystem Technologies; Micro and Nanosystems Information Storage and Processing Systems, Springer, Berlin, DE, vol. 15. No. 5, Feb. 7, 2009 (Feb. 7, 2009). pp. 677-686. XP019719726.

Won Kyoung Choi et al: "Development of low temperature bonding using in-based solders". 58th Electronic Components and Technology Conference—May 27-30, 2008 20080527 IEEE, Piscataway, NJ, USA. May 27, 2008 (May 27, 2008). pp. 1294-1299. XP031276362.

Yoon et al: "Investigation of interfacial reaction between Au—Sn solder and Kovar for hermetic sealing application". Microelectronic Engineering. Elsevier Publishers Bv .• Amsterdam. NL. vol. 84. No. 11. Sep. 25, 2007 (Sep. 25, 2007). pp. 2634-2639. XP022266651.

* cited by examiner

METHOD OF MANUFACTURING AN ENCAPSULATION DEVICE

This is a National phase application in the United States of International Patent application PCT/EP2012/070972 filed Oct. 23, 2012 which claims priority on European Patent Application No. 11190264.9 filed Nov. 23, 2011. The entire disclosures of the above patent applications are hereby incorporated by reference.

FIELD OF THE INVENTION

The invention relates to a method of manufacturing an encapsulation device for a micro-electromechanical system or "MEMS" and, in particular, for a MEMS quartz resonator.

BACKGROUND OF THE INVENTION

Electronic components having a MEMS are generally formed by a hermetically closed case inside which the MEMS is mounted. The MEMS may be, for example, a piezoelectric resonator, such as a quartz resonator intended to be connected to an oscillator circuit. Most quartz resonators of small dimensions, which are used, for example, in electronic or electromechanical watches, are tuning fork resonators.

These quartz resonators are usually in vacuum sealed cases, in the case where low frequency signals are generated, delivered by the oscillator circuit, or in an inert gas atmosphere. Further, one portion of the cover may be transparent to a determined wavelength of a light beam so as to allow optical adjustment of the quartz resonator.

Generally, these resonators are mounted in cases, for example made of ceramic, which are relatively flat. These cases include a main hollow portion of parallelepiped shape inside which the resonator is mounted, and a rectangular cover fixed to the main portion.

In order to ensure the sealing between the cover and main portion, a sealing gasket is currently used, made of a eutectic gold and tin based metal alloy which is assembled between the two portions and the assembly is then heated so as to permanently seal the case in a controlled atmosphere.

These gold-tin based alloys have the drawback of using intrinsically expensive materials and having a relatively low melting point, i.e. of around 278° C. This latter feature limits the possible methods used during or after the connection of the case to its medium of use such as a printed circuit board, for example. Indeed, it is clear that no heat treatment higher than 280° C. can be carried out subsequent to the connection, otherwise the case is liable to become unsealed, which, even partially, would result in a loss of hermeticity of the device and thus a loss of resonator performance.

SUMMARY OF THE INVENTION

It is an object of the present invention to overcome all or part of the aforementioned drawbacks, by providing a novel type of hermetic encapsulation device and the method for manufacturing the same.

The invention therefore relates to an element arranged to cooperate with another part to form an encapsulation device for a component including the element at least partially coated with a metallization, characterized in that said metallization includes at least one layer of metal protected by an intermetallic compound which is coated by a non-diffused portion of a material whose melting point is lower than 250° C.

Advantageously according to the invention, said at least one metal layer is protected by the intermetallic compound(s) which forms a protective barrier. Further, there remains material whose melting point is lower than 250° C. for the future formation of sealing means.

In accordance with other advantageous features of the invention:
- the element is a cover intended to close said encapsulation device;
- the element is a main portion intended to form a cavity of the encapsulation device;
- the element is formed of ceramic or metal;
- said at least one metal layer includes nickel and/or copper and/or gold;
- said at least one metal layer is formed by the body of the element;
- said at least one metal layer further includes an adhesion layer for adhesion to said body of the element;
- the adhesion layer includes molybdenum and/or tungsten and/or titanium and/or chromium;
- the intermetallic compound includes gold;
- said material whose melting point is lower than 250° C. is indium or tin.

Further, the invention relates to a method for manufacturing an element arranged to cooperate with another part in order to form an encapsulation device for a component including the following steps:
  a) forming the element;
  b) depositing a metallization including at least one metal layer protected by a coating;
characterized in that the method further includes the following steps:
  c) depositing a layer of material whose melting point is lower than 250° C. on the coating;
  d) partially diffusing the material whose melting point is lower than 250° C. in the coating in order to entirely transform the coating into an intermetallic compound and leave a non-diffused portion of material whose melting point is lower than 250° C.

Advantageously according to the invention, the material whose melting point is lower than 250° C. which is deposited is a pure material and not a eutectic gold based alloy for the future formation of sealing means.

In accordance with other advantageous features of the invention:
- the element is formed of ceramic or metal;
- said at least one metal layer includes nickel and/or copper and/or gold;
- said at least one metal layer is formed by the body of the element;
- the method includes, between step a) and step b), a step consisting in depositing an adhesion layer for said at least one metal layer;
- the adhesion layer includes molybdenum and/or tungsten and/or titanium and/or chromium;
- the coating includes gold.

Further, the invention relates to an encapsulation device arranged to receive a component including a case comprising a main portion forming a cavity which is hermetically closed by a cover with the aid of sealing means, characterized in that the sealing means include an intermetallic compound formed by at least one metal with a material whose melting point is lower than 250° C. in order to allow the interdiffusion thereof in the liquid state with said at least one metal.

In accordance with other advantageous features of the invention:
- the sealing means include a second intermetallic compound adjacent to said first intermetallic compound formed by at least a second metal with the material whose melting point is lower than 250° C.;
- said at least one second metal includes gold;
- the sealing means include a third intermetallic compound of substantially identical nature to the first intermetallic compound, the first and third intermetallic compounds being located on either side of the second intermetallic compound;
- the sealing means include at least one layer adhering to the case;
- the sealing means include a layer of said at least one metal between the cover and said intermetallic compound and between the main portion and said intermetallic compound;
- the sealing means include a layer of said at least one metal between the main portion and said intermetallic compound and inside the cover;
- said material whose melting point is lower than 250° C. is indium or tin;
- said at least one metal layer includes nickel and/or copper and/or gold;
- the case is formed of ceramic and/or metal;
- the cavity is in a vacuum or in a controlled atmosphere.

Finally, the invention relates to a method of manufacturing an encapsulation device for a component, characterized in that it includes the following steps:
- e) forming said component;
- f) forming a main portion including a first metallization and forming a cavity, and a cover including a second metallization, the main portion or the cover being made in accordance with the method according to any of the preceding embodiments;
- g) mounting the component in the cavity;
- h) assembling the portion of the material whose melting point is lower than 250° C., of the main portion or of the cover, which is not diffused in step d), respectively against the metallization of the cover or of the main portion;
- i) totally diffusing the non-diffused portion of the material whose melting point is lower than 250° C. in said adjacent metallization in order to entirely transform the material whose melting point is lower than 250° C. into a second intermetallic compound capable of hermetically closing said component inside said encapsulation device.

Thus, for currently used cases, whose metallizations already include nickel, it is clear that it is necessary simply to add the material having a low melting point in order to hermetically close the case. Further, the nickel base is substantially cheaper than gold and also makes it possible to obtain at least one intermetallic compound whose melting point is at a higher temperature than currently used sealing means and is thus compatible with the temperatures used in standard methods for mounting the device, without risking a loss of hermeticity.

Further, in comparison to currently used sealing means, the second intermetallic compound(s) formed from nickel was found to have slower growth kinetics which advantageously allows for improved control of the compound formation. Finally, the second intermetallic compound(s) is formed solely from said at least one nickel layer of the main portion owing to the first intermetallic compound(s) which blocks any other diffusion.

In accordance with other advantageous features of the invention:
- the method includes, between step f) and step g), the step consisting in depositing a protective layer in order to protect said metallization which is not coated by the non-diffused portion;
- the main portion and the cover are formed of ceramic and/or metal;
- step i) is performed in a vacuum or in a controlled atmosphere;
- said component is a quartz tuning fork resonator;
- the material whose melting point is lower than 250° C. is indium or tin.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

In the following description, all those parts of the component that are well known to those skilled in the art in this technical field will not be described in detail.

Figure 1:
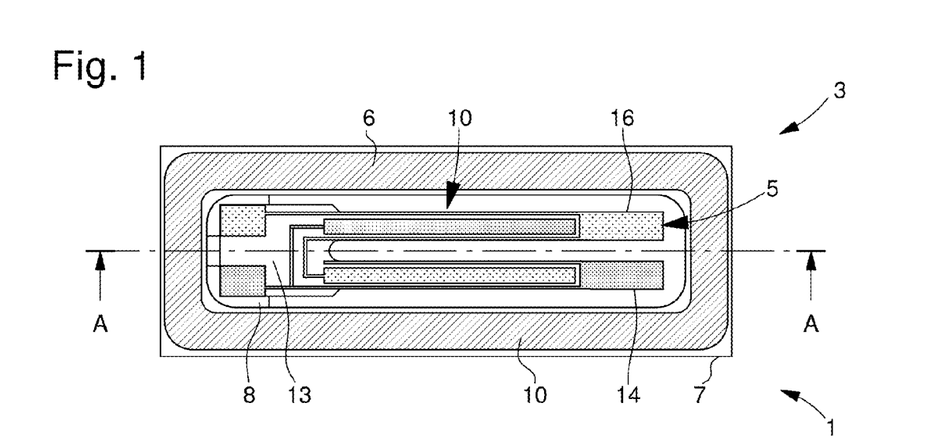
FIG. 1 is a top view of the electronic component according to the invention.
Figure 2:
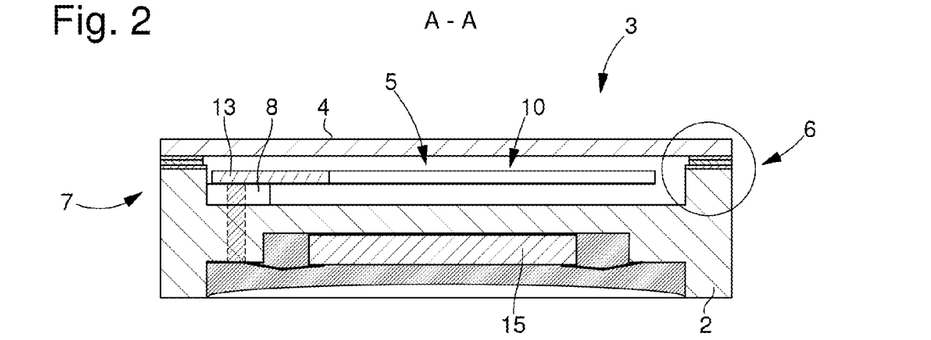
FIG. 2 is a view along cross-section A-A of FIG. 1 of the electronic component according to the invention.

Electronic component 1 is shown in a simplified manner in FIGS. 1 and 2. It mainly includes an encapsulation device 3 intended to receive a MEMS 5 in a hermetic manner. Encapsulation device 3 includes a case 7 formed by a hollow main portion 2 and a cover 4 intended to close hollow portion 2 using sealing means 6.

In the example illustrated in FIGS. 1 and 2, the MEMS 5 shown is a quartz tuning fork resonator, however, other types of MEMS 5 requiring encapsulation in a vacuum or in a controlled atmosphere are also applicable.

Hollow portion 2 is generally of parallelepiped shape and includes a shoulder 8 in inner cavity 10 intended to secure the MEMS 5 in a cantilever arrangement. The free ends of the walls surrounding cavity 10 are intended to receive substantially rectangular cover 4 with the aid of sealing means 6 in order to hermetically close MEMS 5 inside encapsulation device 3.

By way of example, case 7, i.e. hollow portion 2 and cover 4 may be 5 mm long, 3.2 mm wide and 1.08 mm high. Further, case 7 is preferably made of ceramic using an ordinary technique.

Sealing means 6 are formed by a series of layers intended to adhere to the ceramic and to form the layer permitting hermeticity. Advantageously according to the invention, sealing means 6 include a nickel based alloy associated with a material whose melting point is low, i.e. much lower than that of nickel, such as for example around 250° C. maximum. Preferably, the material used may be indium or tin.

These In—Ni or Ni—Sn alloys, which may include several intermetallic compounds, are obtained by a weld involving a solid-liquid interdiffusion, i.e. the difference in melting point between indium or tin with respect to that of nickel allows one of these first materials to be melted and diffused in the solid nickel layer in order to form intermetallic compounds.

These welds may thus be made at "low" temperatures, i.e. below 250° C. yet allow for posterior heat treatments at much higher temperatures resulting from the melting points of the intermetallic compounds obtained, i.e. comprised between 400° C. and 800° C.

Figure 3:
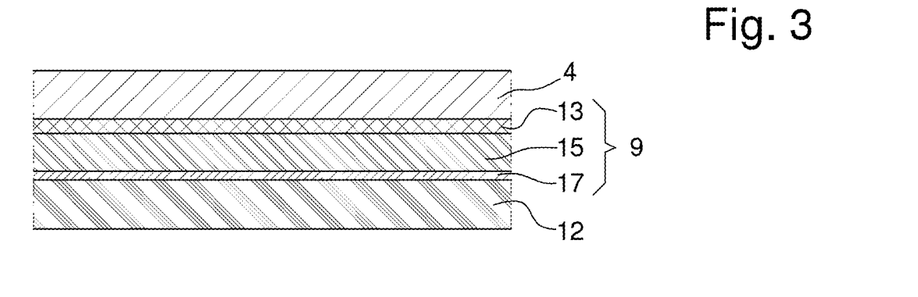
FIGS. 3 and 4 are enlarged localized views of the cover before and after the first diffusion according to the invention.
Figure 5:
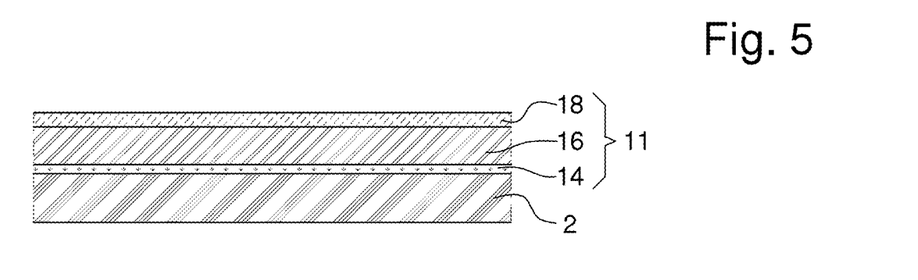
FIG. 5 is an enlarged localized view of the main portion before the second diffusion according to the invention.

Advantageously according to the invention, currently marketed ceramic cases 7 include metallizations 9, 11 which already include at least one nickel layer as seen in FIGS. 3 and 5.

Typically, as visible in FIG. 3, metallization 9 of cover 4 includes several layers. A first optional adhesion layer 13 formed with, for example, molybdenum or tungsten and at least one metal layer 15, such as nickel. Metallization 9 may also include a protective coating 17 against oxidation, for example made of gold. Adhesion layer 13 and metal layer 15 have respective thickness of 10 µm and 5 µm while that of protective coating 17 is around 0.75 µm.

Similarly, as seen in FIG. 5, metallization 11 of main portion 2 also includes several layers. A first optional adhesion layer 14 formed with, for example, molybdenum or tungsten and at least one metal layer 16, such as nickel. Metallization 11 may also include a protective layer 18 against oxidation, for example made of gold. Adhesion layer 14 and metal layer 16 have respective thickness of 10 µm and 5 µm while that of protective coating 18 is around 0.75 µm.

Thus it is understood that, to form sealing means 6 in an indium-nickel or nickel-tin intermetallic compound, a single layer 12 of pure indium or pure tin is necessary to form the weld by solid-liquid interdiffusion according to the invention.

Consequently, with the aid of sealing means 6, MEMS 5 can be contained in a vacuum or in a controlled atmosphere inside cavity 10 of encapsulation device 3 with the use of less expensive materials and while obtaining at least one intermetallic compound whose melting point is at a higher temperature than currently used sealing means.

In the example illustrated in FIGS. 1 and 2, MEMS 5 is a conventional quartz tuning fork formed of two parallel tines 14, 16 for vibration in bending mode whose common base 13 is fixed to shoulder 8. The metallization layers of MEMS 5 necessary for piezoelectric activation and the connection pads to an integrated circuit 15 having, for example, an oscillator stage are not presented in detail since these elements are not essential for the application of the invention.

Method 21 for manufacturing encapsulation device 3 will now be explained with reference to FIGS. 3 to 7. Method 21 includes a first step 23 for the independent manufacture, in phases 22, 24 and 26 respectively of MEMS 5, cover 4 and hollow portion 2.

Figure 7:
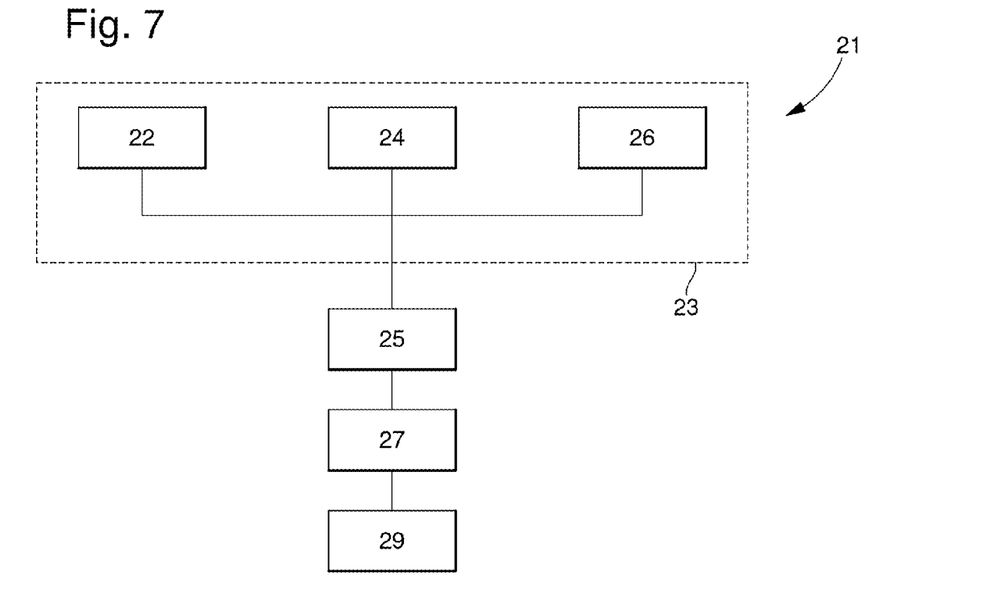
FIG. 7 is a flow diagram of the manufacturing method according to the invention.

Thus, if MEMS 5 is a quartz tuning fork resonator, phase 22 may consist in etching a wafer in a single crystal quartz, then etching the tuning fork body in the thickness of the wafer and finally equipping the tuning fork, i.e. depositing the electrically conductive layers necessary for the operation thereof.

Cover 4 is preferably formed using a ceramic in phase 24. To achieve this, in the usual manner, one or several ceramic sheets are worked, stacked and fixed one on top of the other. Next, cover 4 is partially metallized to permit future cooperation with main portion 2. According to the invention, after the formation of cover 4, there is deposited at least one layer 15 of metal protected by a coating 17. Cover 4 thus includes several metal layers. A first optional adhesion layer 13 formed with, for example, molybdenum and/or tungsten and/or titanium and/or chromium and at least one metal layer 15 such as nickel.

Adhesion layer 13 and metal layer 15 may have respective thickness of 10 µm and 5 µm while that of protective coating 17 is around 0.75 µm.

Main portion 2 is preferably formed using a ceramic in phase 26. To achieve this, in the usual manner, several sheets of ceramic are worked, stacked and fixed one on top of the other. Next, main portion 2 is partially metallized to permit future cooperation with cover 4.

According to the invention, after the formation of main portion 2, there is deposited at least one metal layer 16 such as nickel possibly protected by a coating 18 which may, for example, be made of gold. Further, prior to the deposition of layer 16, for example made of nickel, an intermediate step of depositing an adhesion layer 14 for layer 16 may be carried out.

As explained above, main portion 2 thus includes several metal layers. A first optional adhesion layer 14 formed with, for example, molybdenum and/or tungsten and/or titanium and/or chromium and at least one metal layer 16. Layer 16 may include a protective coating 18 against oxidation, for example made of gold as illustrated in FIG. 5.

Adhesion layer 14 and metal layer 16 may have respective thickness of 10 µm and 5 µm while that of optional protective coating 18 is around 0.75 µm. These depositions may be carried out, for example, by screen printing, electroplating or physical vapour phase deposition.

Advantageously according to the invention, phase 24 or phase 26 of method 21 continues with a step of depositing a layer 12 of a material whose melting point is lower than 250° C. on coating 17, 18 for example formed of gold, of cover 4 or of main portion 2. As explained above, the material whose melting point is lower than 250° C. may be indium or tin. A diagram wherein layer 12 is deposited on cover 4 is shown in FIG. 3.

The thickness of layer 12 is important since, in a first phase, it is used to form a first intermetallic compound with one of protective layers 17, 18 and, in a second phase, it is used to form a second intermetallic compound with at least one of metallization layers 11, 9 of main portion 2 or of cover 4, as explained below.

Thus, phase 24 or 26 ends with a step intended to partially diffuse the material whose melting point is lower than 250° C. in coating 17, 18 in order to entirely transform coating 17,18 into an intermetallic compound capable of forming a protective layer 19 for said at least one metal layer 15. A diagram wherein layer 19 is formed on cover 4 is shown in FIG. 4.

It is thus understood that one part of layer 12 is used and that at the end of phase 24 or 26, layer 12 becomes layer 12' which is less thick but still of the same nature. Advantageously according to the invention, the diffusion step may be carried out at ambient temperature, it is however possible to accelerate the step by heating the assembly The thickness of said at least one metal layer 15, 16 used for the final diffusion is also important since it is used to entirely "Consume" layer 12' by forming a second intermetallic component intended to hermetically close case 7. The nature of the other at least one metal layer 16, 15 present during the first diffusion is of less importance in that it will not react or only barely interact.

Figure 4:
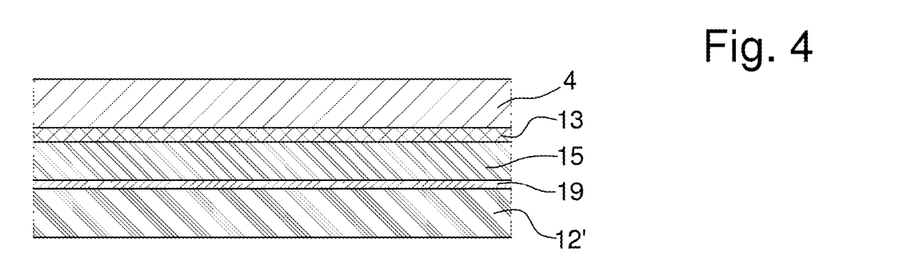

At the end of step 24 or 26, it is understood that said at least one layer 15, 16 includes a protective coating 19 against oxidation, for example made of gold-indium or gold-tin alloy, and layer 12' which is the non-diffused remainder of the indium or tin layer 12 as illustrated in FIG. 4. Layer 12 may have a thickness comprised between 15 and 60 μm.

After diffusion, layers 13, 14 and 15, 16 remain unchanged. However, there is obtained a protective layer 19 of around 5 μm and a layer 12' comprised between 13.5 and 58.5 μm. These depositions may be achieved, for example, by screen printing, electroplating or physical vapour phase deposition.

In a second step 25, MEMS 5 is mounted in cavity 10 of hollow portion 2 then, in a third step 27, case 7 is assembled by placing the metal layers facing each other and in contact with each other. Finally, method 21 includes a final step 29 consisting in welding the metal layers to form sealing means 6 and thus to permanently seal encapsulation device 3. As explained above, depending upon the MEMS 5 to be encapsulated, step 29 and possibly step 27 is/are in a vacuum or controlled atmosphere.

Step 29 is intended to completely diffuse the remainder 12' of the material whose melting point is lower than 250° C. in said at least one layer 15, 16 facing the material so as to completely transform the material with a melting point lower than 250° C. into a second intermetallic compound 20 capable of hermetically closing said component inside encapsulation device 3 even at temperatures of between 400 and 800° C. Step 29 may consist in pressing cover 4 against hollow portion 2 while liquefying layer 12' by heating.

It is thus clear that layer 12' is totally "Consumed" by layers 16 and/or 15 to form a layer 20 of a second intermetallic compound, for example an indium-nickel or nickel-tin based compound. However, there remain layers 16' and/or 15' which are the non-diffused remainder of layer 16 and/or 15 as illustrated in FIG. 6.

Consequently, after diffusion, there remain layers 15' and 16' of metal, such as for example nickel, and, possibly, layers 13 and 14 which remain unchanged. In the case where a protective layer 18 is used, it will migrate, thickening layer 19 which becomes 19' as illustrated in FIG. 6.

Figure 8:
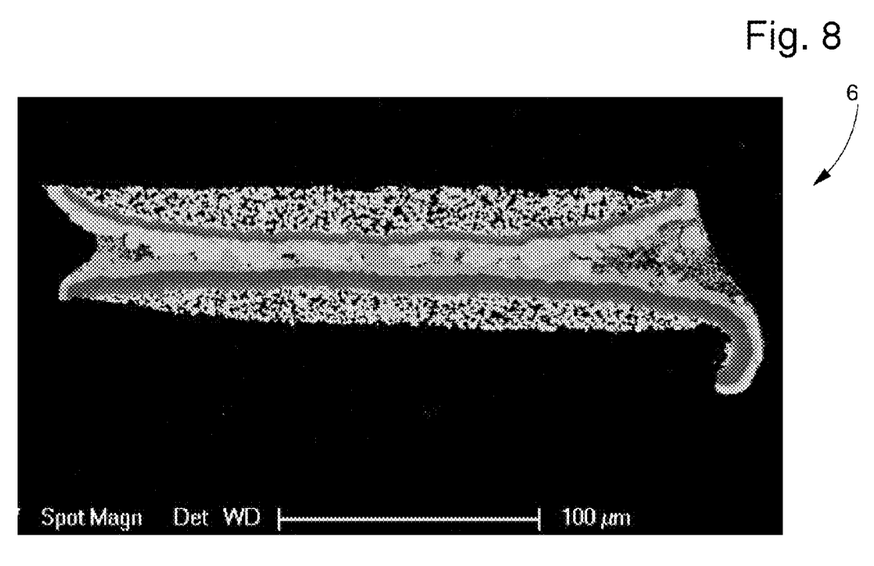
FIG. 8 is a cross-section of an example of sealing means obtained according to the invention.
Figure 9:
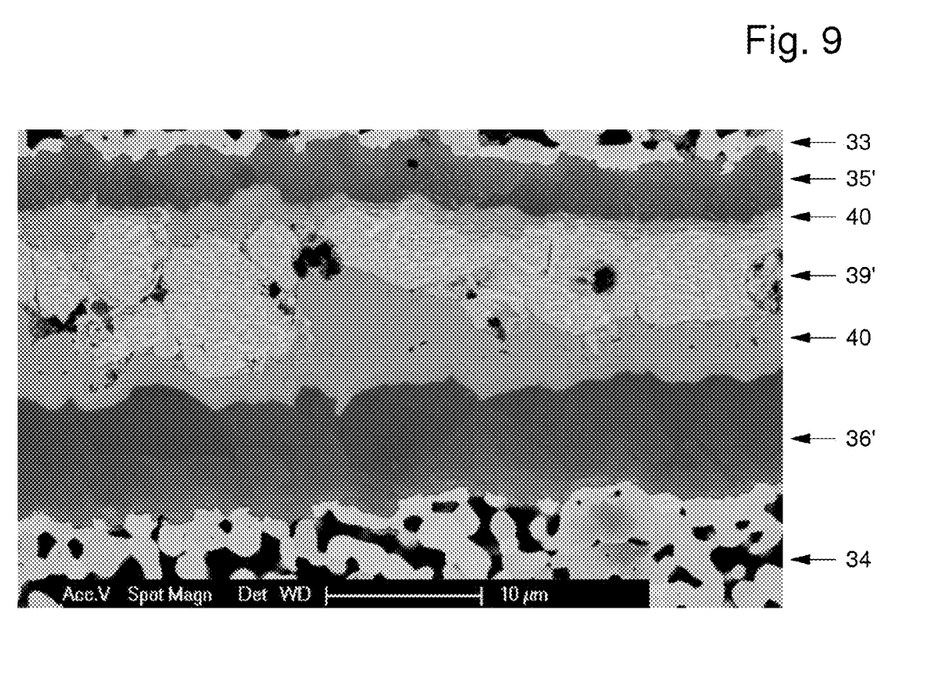
FIG. 9 is a partial enlarged view of FIG. 8.

Another example of sealing means 6 obtained according to the invention is presented in FIGS. 8 and 9. In this variant, the material whose melting point is lower than 250° C. is indium, the protective layers are gold and said metal layers are nickel-cobalt. As visible in FIGS. 8 and 9, there is obtained from the top downwards, an adhesion layer 33 (W), a first metal layer 35' (NiCo), a first layer 40 of intermetallic compound (InNiAu), a layer of intermetallic compound 39' (AuIn$_2$), a second layer 40 of intermetallic compound (InNiAu), a layer 36' (NiCo) and an adhesion layer 34 (W). Advantageously according to the invention, cover 4 may be either above layer 33 or below layer 34.

Figure 6:
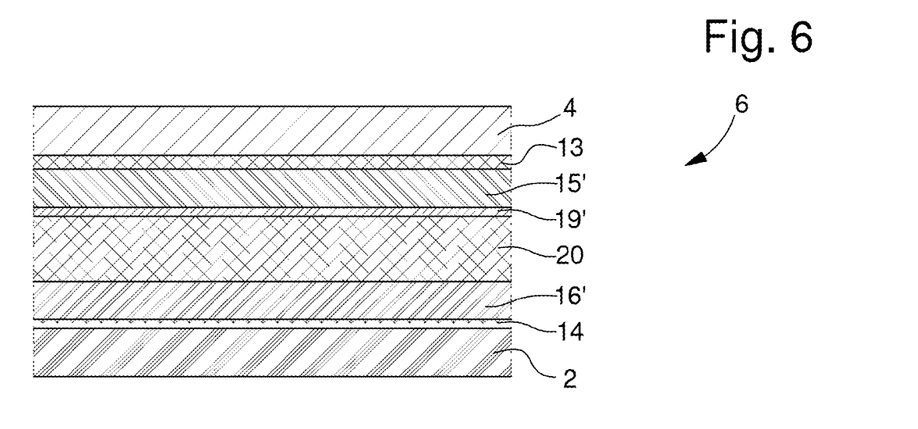
FIG. 6 is an enlarged localized view of the interface between the main portion and the cover after the second diffusion according to the invention.

It is also understood in the example of FIG. 9 compared to that of FIG. 6, that the two at least one metal layers may interact with each other to form two intermetallic compounds 40 surrounding intermetallic compound 39' formed in phase 24 or 26 without departing from the scope of the invention.

Advantageously according to the invention, in comparison to currently used sealing means, it was found that, in addition to their lower cost, intermetallic compounds formed from nickel have slower growth kinetics which advantageously allows for improved control of the compound formation.

Optionally, if MEMS 5 is a quartz tuning fork resonator, it may require adjustment or setting. This adjustment may be effected after step 25 or after step 29. In this latter case, i.e. when cover 4 has already hermetically closed hollow portion 2 of case 7 in a vacuum, cover 4 will have to include at least one portion transparent to a determined wavelength of a light beam, such as a laser beam, used to carry out said adjustment.

Using the present method 21, the electronic component 1 formed is thus configured as a surface mounting device or SMD. Accordingly, it may be mounted and connected by soldering, for example on a printed circuit board.

Of course, the present invention is not limited to the illustrated example but is capable of various variants and modifications which will be evident to those skilled in the art. In particular, electronic component 1 my comprise only resonator element 5, or alternatively, method 21 could be adapted for a wafer-level-packaging process, i.e. series encapsulation using two wafers placed one against the other which are subsequently cut to form electronic component 1.

Further, the cover and/or main part may be made of metal and not ceramic. By way of example, FIGS. 10 to 13 present two variants with a metal cover 44, 64. Typically, metallizations 49, 69 totally coat the cover and/or the main part when they are made of metal. It is understood, however, that the coating may also be partial which has no negative effect on sealing means 6.

Figure 10:
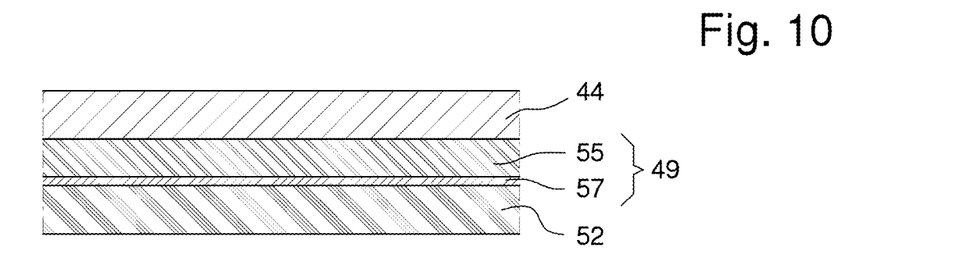
FIGS. 10 and 11 are enlarged localized views of a first cover embodiment before and after the first diffusion according to the invention.
Figure 11:
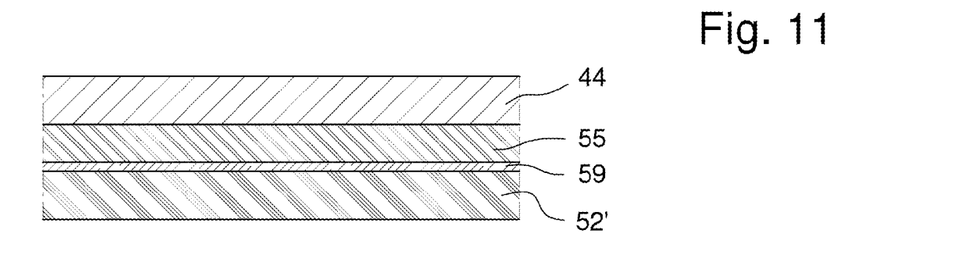

In a first variant visible in FIGS. 10 and 11, metal cover 44, which is for example kovar-based, includes a metallization 49 having several layers. Metallization 49 includes at least one layer of metal 55 such as nickel or copper. Metallization 49 may also include a protective coating 57 against oxidation, for example made of gold. Metal layer 55 has a thickness of substantially 5 μm whereas protective coating 57 has a thickness of around 0.1 μm.

Advantageously according to the invention, a layer 52 of a material whose melting point is lower than 250° C. is deposited on coating 57 which is for example formed of gold. As explained above, the material whose melting point is lower than 250° C. may be indium or tin. A diagram wherein layer 52 is deposited on cover 44 is shown in FIG. 10.

The thickness of layer 52 is important since, in a first phase, it is used to form a first intermetallic compound with one of the protective layers and, in a second phase, it is used to form a second intermetallic compound with at least one of metallization layers of the main portion or of the cover, as explained below.

Thus, after the diffusion step intended to partially diffuse the material whose melting point is lower than 250° C. in coating 57, the coating 57 is entirely transformed into an intermetallic compound capable of forming a protective layer 59 for said at least one metal layer 55. A diagram wherein layer 59 is formed on cover 44 is shown in FIG. 11.

It is thus understood that one part of layer 52 is used and that at the end of phase 24 or 26, layer 52 becomes layer 52' which is less thick but still of the same nature. At the end of step 24 or 26, it is understood that said at least one layer 55 includes a protective coating 59 against oxidation, for example made of gold-indium or gold-tin alloy, and layer 52' which is the non-diffused remainder of the indium or tin layer 52 as illustrated in FIG. 11. Layer 52 may have a thickness of between 15 and 60 µm and extend over all or part of cover 44 and/or all or part of metallization 49.

After diffusion, layer 55 remains unchanged. However, there is obtained a protective layer 59 of around 5 µm and a layer 52' comprised between 13.5 and 58.5 µm. These depositions may be achieved, for example, by screen printing, electroplating or physical vapour phase deposition.

Figure 12:
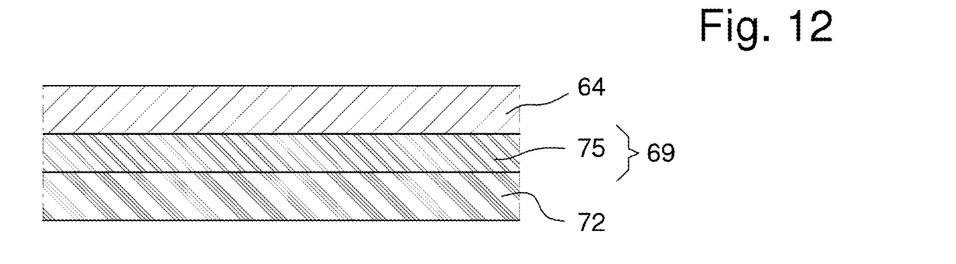
FIGS. 12 and 13 are enlarged localized views of a second cover embodiment before and after the first diffusion according to the invention.
Figure 13:
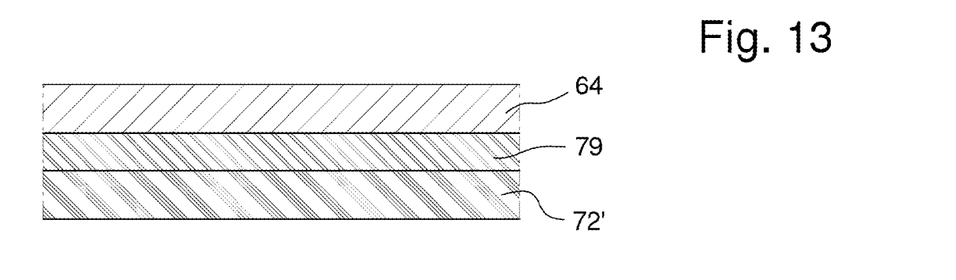

In a second variant visible in FIGS. 12 and 13, metal cover 64 which is for example nickel or copper based, includes a metallization 69 having a single layer. It is thus understood that cover 64 forms a part of the metallization with respect to the explanations set out above. Metallization 69 thus includes at least one metal layer 75 such as gold. Metallization 69 thus still forms a protective coating against oxidation for cover 64. Metal layer 75 has a thickness of around 0.1 µm.

Advantageously according to the invention, a layer 72 of a material whose melting point is lower than 250° C. is deposited on layer 75 which is for example formed of gold. As explained above, the material whose melting point is lower than 250° C. may be indium or tin. A diagram wherein layer 72 is deposited on cover 64 is shown in FIG. 12.

The thickness of layer 72 is important since, in a first phase, it is used to form a first intermetallic compound with cover 64 and, in a second phase, it is used to form a second intermetallic compound with at least one of metallization layers of the main portion, as explained below.

Thus, after the diffusion step intended to partially diffuse the material whose melting point is lower than 250° C. in coating 75, the coating 75 is entirely transformed into an intermetallic compound capable of forming a protective layer 79 for said at least one metal layer 64. A diagram wherein layer 79 is formed on cover 64 is shown in FIG. 13.

It is thus understood that one part of layer 72 is used and that at the end of phase 24 or 26, layer 72 becomes layer 72' which is less thick but still of the same nature. At the end of step 24 or 26, it is understood that cover 64 includes a protective coating 79 against oxidation, for example made of gold-indium or gold-tin alloy, and layer 72' which is the non-diffused remainder of the indium or tin layer 72 as illustrated in FIG. 13. Layer 72 may have a thickness of between 15 and 60 µm and extend over all or part of cover 64 and/or all or part of metallization 69.

After diffusion, the body of cover 64 remains unchanged. However, there is obtained a protective layer 79 of around 5 µm and a layer 72' comprised between 13.5 and 58.5 µm. These depositions may be achieved, for example, by screen printing, electroplating or physical vapour phase deposition.

It is also possible to envisage mounting the oscillator circuit in the same cavity 10 as quartz resonator 5. This oscillator circuit may also have a real time clock function (RTC) or other functions.

It may also be envisaged to mount one or more MEMS 5 in each case 7 or to use alternative materials for cases 7 such as metal or glass, without departing from the scope of the invention. Likewise, the form of metallizations 9, 11 is not in any way limited to that of FIGS. 1 and 2.

It is also possible for phases 22, 24 and 26 not to be entirely independent, according to the MEMS technology employed. It is therefore possible to envisage performing phase 26, consisting in forming hollow portion 2, prior to phase 22 of forming MEMS 5 in the case where MEMS 5 is directly etched in portion 2.

Finally, a "getter" type of material may be arranged in encapsulation device 3 to serve as a vacuum pump, i.e. to improve the vacuum in the pre-fabricated device 3, when it is activated, for example by means of a laser, or during the heat sealing/diffusion process, simply through the use of temperature and time.

The invention claimed is:

1. A method for fabricating an encapsulation device for a micro-electromechanical system, the method comprising:
   forming the micro-electromechanical system including a main portion forming a cavity and a cover;
   depositing, on the main portion and the cover, a first and a second metallizations respectively including at least a first metal protected by a first anti-oxidation material, and at least a second metal protected by a second anti-oxidation material;
   depositing a layer of a material whose melting point is lower than 250° C. on solely the first metallization;
   partially diffusing the material whose melting point is lower than 250° C. in solely the first anti-oxidation material in order to entirely transform said first anti-oxidation material into an intermetallic compound formed of said first anti-oxidation material and of said material whose melting point is lower than 250° C. in order to protect the first metal, and to leave a portion of the material whose melting point is lower than 250° C. and which has not been partially diffused;
   mounting the micro-electromechanical system in the cavity of the main portion;
   assembling the portion of the material whose melting point is lower than 250° C. which has not been partially diffused in the partially diffusing against the second metallization; and
   totally diffusing the portion of material whose melting point is lower than 250° C. which has not been partially diffused in the partially diffusing in the second metallization in order to entirely transform the portion of material whose melting point is lower than 250° C. which has not been partially diffused in the partially diffusing into a second intermetallic compound formed by the second anti-oxidation material, the material whose melting point is lower than 250° C. and the second metal, so as to hermetically close the micro-electromechanical system inside the encapsulation device.

2. The method according to claim 1, wherein the first anti-oxidation material or the second anti-oxidation material is made of gold.

3. The method according to claim 2, wherein the first anti-oxidation material and the second anti-oxidation material are formed of the same material.

4. The method according to claim 1, wherein said at least one first metal and said at least one second metal each include nickel, copper or nickel-cobalt.

5. The method according to claim 4, wherein said at least one first metal and said at least one second metal are formed of the same material.

6. The method according to claim 1, wherein the method further includes, after the depositing of the first and the second metallizations depositing an adhesion layer for at least one of said first and second metallizations.

7. The method according to claim 6, wherein the adhesion layer includes at least one of molybdenum, tungsten, titanium, and chromium.

8. The method according to claim 1, wherein the main portion and the cover are formed of ceramic and/or metal.

9. The method according to claim 1, wherein the total diffusing of the portion of material is carried out in a vacuum or in a controlled atmosphere.

10. The method according to claim 1, wherein the micro-electromechanical system is a quartz tuning fork resonator.

11. The method according to claim 1, wherein the material whose melting point is lower than 250° C. is indium.

12. The method according to claim 1, wherein the material whose melting point is lower than 250° C. is tin.

13. The method according to claim 1, wherein, prior to the total diffusing of the portion of material, the method further includes arranging a getter material in the encapsulation device to improve a vacuum in the encapsulation device.

14. A method for fabricating an encapsulation device for a micro-electromechanical system, the method comprising:

forming the micro-electromechanical system including a main portion forming a cavity and a cover;

depositing, on the main portion and the cover, a first and a second metallizations respectively including at least a first metal protected by a first anti-oxidation material, and at least a second metal protected by a second anti-oxidation material;

depositing a layer of a material whose melting point is lower than 250° C. on solely the second metallization;

partially diffusing the material whose melting point is lower than 250° C. in solely the second anti-oxidation material in order to entirely transform said second anti-oxidation material into an intermetallic compound formed of said second anti-oxidation material and of said material whose melting point is lower than 250° C. in order to protect the second metal, and to leave a portion of the material whose melting point is lower than 250° C. and which has not been partially diffused;

mounting the micro-electromechanical system in the cavity of the main portion;

assembling the portion of the material whose melting point is lower than 250° C. which has not been partially diffused in the partially diffusing against first metallization; and totally diffusing the portion of material whose melting point is lower than 250° C. which has not been partially diffused in the partially diffusing in the first metallization in order to entirely transform the portion of material whose melting point is lower than 250° C. which has not been partially diffused in the partially diffusing into a first intermetallic compound formed by the first anti-oxidation material, the material whose melting point is lower than 250° C. and the first metal, so as to hermetically close the micro-electromechanical system inside the encapsulation device.

* * * * *